(12) United States Patent
Kusaka et al.

(10) Patent No.: US 11,892,503 B2
(45) Date of Patent: Feb. 6, 2024

(54) SEMICONDUCTOR DEVICE AND TEST METHOD OF SEMICONDUCTOR DEVICE

(71) Applicant: KIOXIA CORPORATION, Tokyo (JP)

(72) Inventors: Takuya Kusaka, Yokohama Kanagawa (JP); Hirosuke Narai, Tokyo (JP); Kazunori Masuda, Yokohama Kanagawa (JP); Makoto Iwai, Chigasaki Kanagawa (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/898,102

(22) Filed: Aug. 29, 2022

(65) Prior Publication Data

US 2023/0296669 A1 Sep. 21, 2023

(30) Foreign Application Priority Data

Mar. 17, 2022 (JP) ................. 2022-043053

(51) Int. Cl.
*G01R 31/28* (2006.01)
*H01L 23/00* (2006.01)
(Continued)

(52) U.S. Cl.
CPC ..... *G01R 31/2896* (2013.01); *G01R 31/2853* (2013.01); *G01R 31/2884* (2013.01);
(Continued)

(58) Field of Classification Search
CPC ............ G01R 31/2896; G01R 31/2853; G01R 31/2884; H01L 23/5386; H01L 24/48; H01L 25/0657; H01L 23/49816; H01L 23/49838; H01L 2224/48147; H01L 2224/48149; H01L 2224/48229;
(Continued)

(56) References Cited

U.S. PATENT DOCUMENTS 11,545,464 B2 * 1/2023 Xu ..................... H01L 23/5389
2013/0026550 A1 1/2013 Yoshioka
(Continued)

FOREIGN PATENT DOCUMENTS

JP        2009231375 A    10/2009
TW       201320294 A     5/2013
(Continued)

*Primary Examiner* — Giovanni Astacio-Oquendo
(74) *Attorney, Agent, or Firm* — Kim & Stewart LLP (57) ABSTRACT

A semiconductor device includes first and second chips in a package. A first pad is on the first chip and electrically connected to a node between a power supply pad and a ground pad on the first chip. Second and third pads are on the second chip. An internal wiring connects the first pad to the second pad within the package. A power circuit on the semiconductor chip configured to supply a current to the second pad. A switch is on the second chip between the second pad and the power supply circuit to connect or disconnect the second pad from the power circuit. A control circuit is on the second chip and configured to output a first signal for the switch in response to a test signal supplied to the third pad and a second signal to the power circuit to cause the power circuit to output current.

20 Claims, 6 Drawing Sheets

(51) Int. Cl.
*H01L 25/065* (2023.01)
*H01L 23/538* (2006.01)
*H01L 23/498* (2006.01)

(52) U.S. Cl.
CPC .......... *H01L 23/5386* (2013.01); *H01L 24/48* (2013.01); *H01L 25/0657* (2013.01); *H01L 23/49816* (2013.01); *H01L 23/49838* (2013.01); *H01L 2224/48147* (2013.01); *H01L 2224/48149* (2013.01); *H01L 2224/48229* (2013.01); *H01L 2225/0651* (2013.01); *H01L 2225/06506* (2013.01); *H01L 2225/06562* (2013.01); *H01L 2225/06596* (2013.01); *H01L 2924/1431* (2013.01); *H01L 2924/1438* (2013.01)

(58) Field of Classification Search
CPC ... H01L 2225/06506; H01L 2225/0651; H01L 2225/06562; H01L 2225/06596; H01L 2924/1431; H01L 2924/1438
USPC ...................... 324/750.3, 537, 500
See application file for complete search history.

(56) References Cited

U.S. PATENT DOCUMENTS

| | | |
|---|---|---|
| 2014/0092508 A1 | 4/2014 | Ko |
| 2015/0054532 A1 | 2/2015 | Yoo |
| 2016/0035672 A1 | 2/2016 | Funaya |
| 2016/0216313 A1 | 7/2016 | Ogawa |
| 2016/0291086 A1 | 10/2016 | Chou |
| 2018/0356462 A1 | 12/2018 | Oh |
| 2019/0042030 A1 | 2/2019 | Saaski |
| 2020/0075497 A1 | 3/2020 | Dabral |
| 2020/0284836 A1* | 9/2020 | Tu .................. G11C 7/1063 |
| 2023/0139378 A1* | 5/2023 | Lee .................. H01L 24/73 257/690 |

FOREIGN PATENT DOCUMENTS

| | | |
|---|---|---|
| TW | 201413910 A | 4/2014 |
| TW | 201628013 A | 8/2016 |
| TW | 201801885 A | 1/2018 |
| TW | 201820589 A | 6/2018 |
| TW | 202209697 A | 3/2022 |

* cited by examiner

SEMICONDUCTOR DEVICE AND TEST METHOD OF SEMICONDUCTOR DEVICE

CROSS-REFERENCE TO RELATED APPLICATION

This application is based upon and claims the benefit of priority from Japanese Patent Application No. 2022-043053, filed Mar. 17, 2022, the entire contents of which are incorporated herein by reference.

FIELD

Embodiments described herein relate generally to a semiconductor device and a test method of the semiconductor device.

BACKGROUND

A multi-chip package (MCP) where a plurality of semiconductor chips are mounted in one semiconductor package is known. Wirings of a part of the plurality of semiconductor chips are connected inside the semiconductor package rather than outside of the semiconductor package. When a connection detection test of internal wiring in the semiconductor package is executed, a circuit for executing connection detection needs to be provided in a semiconductor chip inside the package and the required circuit area (e.g., die size) of the semiconductor chip increases.

DETAILED DESCRIPTION

Embodiments provide a semiconductor device for which a connection detection test of internal wiring in a semiconductor package can be executed without increasing circuit area and a test method for such a semiconductor device.

In general, according to one embodiment, a semiconductor device includes a first semiconductor chip in a package and a second semiconductor chip in the package. A first pad is on the first semiconductor chip and electrically connected to a node between a power supply pad and a ground pad on the first semiconductor chip. A second pad is on the second semiconductor chip. A third pad is on the second semiconductor chip. An internal wiring connects the first pad to the second pad within the package. A power supply circuit on the second semiconductor chip is configured to supply a current to the second pad. A switch is on the second semiconductor chip between the second pad and the power supply circuit to connect or disconnect the second pad from the power supply circuit. A control circuit is on the second semiconductor chip configured to output a first control signal for controlling ON and OFF states of the switch in response to a test signal supplied to the third pad, and a second control signal to the power supply circuit to cause the power supply circuit to output current.

Hereinafter, certain example embodiments will be described with reference to the drawings.

First Embodiment

Figure 1:
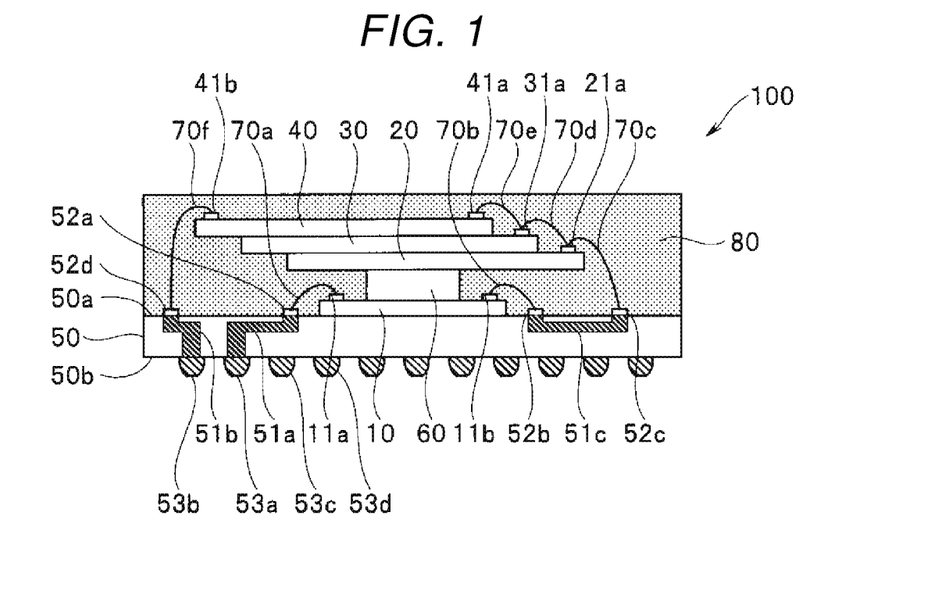
FIG. 1 is a cross-sectional view of a semiconductor device according to a first embodiment.

FIG. 1 is a cross-sectional view illustrating a structure of a semiconductor device according to a first embodiment. A semiconductor device 100 illustrated in FIG. 1 includes a plurality of semiconductor chips (10, 20, 30, and 40), a wiring substrate 50, a spacer 60, a plurality of bonding wires (70a, 70b, 70c, 70d, 70e, and 70f), and a sealing resin 80. The bonding wires 70a, 70b, 70c, 70d, 70e, and 70f can each be referred to as a "bonding wire 70" or collectively as "bonding wires 70". In addition, the semiconductor device 100 includes four semiconductor chips (10, 20, 30, and 40), but in other examples only two such semiconductor chips are included. In general, the number of semiconductor chips may be any number of two or more. The semiconductor device 100 may be a multi-chip memory device.

The wiring substrate 50 includes a first surface 50a and a second surface 50b. In addition, the wiring substrate 50 includes multiple wiring layers 51a, 51b, and 51c on a surface and/or therein. The wiring layers 51a, 51b, and 51c can each be referred to as a "wiring layer 51" or collectively as "wiring layers 51". The wiring substrate 50 is, for example, an insulating resin wiring substrate or a ceramic wiring substrate. Specifically, for example, a printed wiring substrate formed of a glass-epoxy resin is used. In general, the surface of the wiring substrate 50 is covered with a solder resist to protect the wirings.

On the first surface 50a of the wiring substrate 50, bonding pads 52a, 52b, 52c, and 52d are formed. The bonding pads 52a, 52b, 52c, and 52d can each be referred to as a "bonding pad 52" or collectively as "bonding pads 52".

On the second surface 50b of the wiring substrate 50, external terminals 53a, 53b, 53c, and 53d are formed. The external terminals 53a, 53b, 53c, and 53d are, for example, projecting terminals such as solder balls. The external terminals 53a, 53b, 53c, and 53d can each be referred to as an "external terminal 53" or collectively as "external terminals 53".

The bonding pads 52a and 52d are electrically connected to the external terminals 53a and 53b through the wiring layers 51a and 51b, respectively. In addition, the bonding pads 52b and 52c are electrically connected through the wiring layer 51c. In the wiring substrate 50 illustrated in FIG. 1, just some portions of the wiring layers 51, the bonding pads 52, and the external terminals 53 are illustrated.

A semiconductor chip 10 is provided on the first surface 50a of the wiring substrate 50. The spacer 60 is provided on the semiconductor chip 10. Semiconductor chips 20, 30, and 40 are sequentially stacked and disposed on the spacer 60. For example, the semiconductor chip 10 is a semiconductor chip such as a memory controller, and the semiconductor chips 20, 30, and 40 are semiconductor chips such as NAND flash memories that can be controlled by a memory controller. However, the embodiment is not limited to this example. As the semiconductor chips 10, 20, 30, and 40, any semiconductor chip type such as a memory element (such as a DRAM), an arithmetic element (such as a microprocessor), or a signal processing element may be used.

Pads 11a and 11b are formed on the surface of the semiconductor chip 10. Pads 21a and 31a are formed on surfaces of the semiconductor chips 20 and 30, respectively. Pads 41a and 41b are formed on the surface of the semiconductor chip 40. In the semiconductor chips 10, 20, 30, and 40 illustrated in FIG. 1, only some of the pads are illustrated. For example, on each of the semiconductor chips 10, 20, 30, and 40, a power supply pad, a ground pad, and a plurality of signal pads may be provided. For example, signal pads for each of a plurality of signals (for example, input and output signals, a timing signal, a clock signal, an enable signal, or a ready/busy signal) can be formed.

The pads 11a and 11b are electrically connected to the bonding pads 52a and 52b by the bonding wires 70a and 70b, respectively. The pad 21a and the bonding pad 52c are electrically connected by the bonding wire 70c. The pads 21a and 31a are electrically connected by the bonding wire 70d. The pads 31a and 41a are electrically connected by the bonding wire 70e. The pad 41b and the bonding pad 52d are electrically connected by the bonding wire 70f.

In the following description, the wirings in a semiconductor package (semiconductor device 1) by which the semiconductor chip 10 and the semiconductor chip 40 are connected will be referred to as "internal wiring 90" (refer to FIG. 2). That is, in particular, the wirings formed by the bonding wire 70b, the wiring layer 51c, and the bonding wires 70c, 70d, and 70e will be referred to as "internal wiring 90".

The semiconductor chip 10 and the semiconductor chip 20 are connected to each other through a path including the bonding wire 70b, the bonding pad 52b, the wiring layer 51c, the bonding pad 52c, and the bonding wire 70c. However, the embodiment is not limited to this example. For example, the pad 11b of the semiconductor chip 10 and the pad 21a of the semiconductor chip 20 may be directly connected to each by a bonding wire 70. In addition, instead of the connection through a bonding wire 70, s so-called flip-chip connection where the pad on the semiconductor chip 10 and an electrode of the wiring substrate 50 are directly connected may be adopted. Further, a pad of the semiconductor chip 20 and an electrode of the wiring substrate 50 may be connected through the flip-chip configuration. In such a case, the semiconductor chip 10 and the semiconductor chip 20 may be connected through the wirings provided in the wiring substrate 50. In this configuration, the wirings from the pads of the semiconductor chip 10, the wirings provided in the wiring substrate 50, and the pads of the semiconductor chip 20 correspond to the internal wiring 90.

The outer circumference of the semiconductor chips 10, 20, 30, and 40 are sealed with the sealing resin 80 provided on the upper surface side of the wiring substrate 50.

In the semiconductor device 100 having the configuration described above, a connection detection test for testing whether the bonding wire 70 is normally (properly) connected in the semiconductor package may be executed using a tester or the like. This connection detection test is generally called an open-short test. In the open-short test, a current of several tens to about 100 µA flows from the external terminal 53 to a pad measured using the tester. As a result, current is output from the power supply terminal through a protective diode (for protection from electrostatic breakdown) connected to the power supply terminal. In this state, a voltage between the power supply terminal and the ground terminal is measured, and a connection state can be detected (determined) from the measured voltage value.

In this open-short test, the connection detection test can be executed for the bonding wire 70 that is directly connected to the external terminal 53 through the wiring layer 51 and the bonding pad 52. However, the connection detection test cannot be executed for the internal wiring 90 that is connected inside the semiconductor package.

For example, for FIG. 1, the connection detection test could be executed for the wirings (the bonding wires 70a and 70f) that are connected to the external terminals 53a and 53b through the wiring layers 51a and 51b. On the other hand, the connection detection test could not be executed for the internal wiring 90 that is not connected to the external terminal 53.

In order to check the connection state of the internal wiring 90 of the semiconductor package, in the related art, a method such as an X-ray-based inspection (to (X-ray transmission through the sealed semiconductor package for internal observation of connection states) or a method of estimating the connection states from a result of an operational test is used. However, in the X-ray-based inspection, it can still be difficult to determine whether the connection state is electrically open or short-circuited. In addition, in the method of estimating the connection state from a result of an operational test, it is difficult to determine whether defects occur in a semiconductor chip performing the operation(s) or in the internal wiring 90 through which semiconductor chips are connected.

The semiconductor device 100 according to the present embodiment has a configuration where the connection state of the internal wiring 90 can be detected as described below. In particular, when semiconductor chips 10, 20, 30, and 40 are stacked, the connection detection test of the bonding wires 70c and 70d connected to the semiconductor chips 20 and 30 can also be executed by executing the connection detection test of semiconductor chips positioned at ends of the internal wiring 90 most distant from each other (in the example of FIG. 1, the semiconductor chips 10 and 40).

Figure 2:
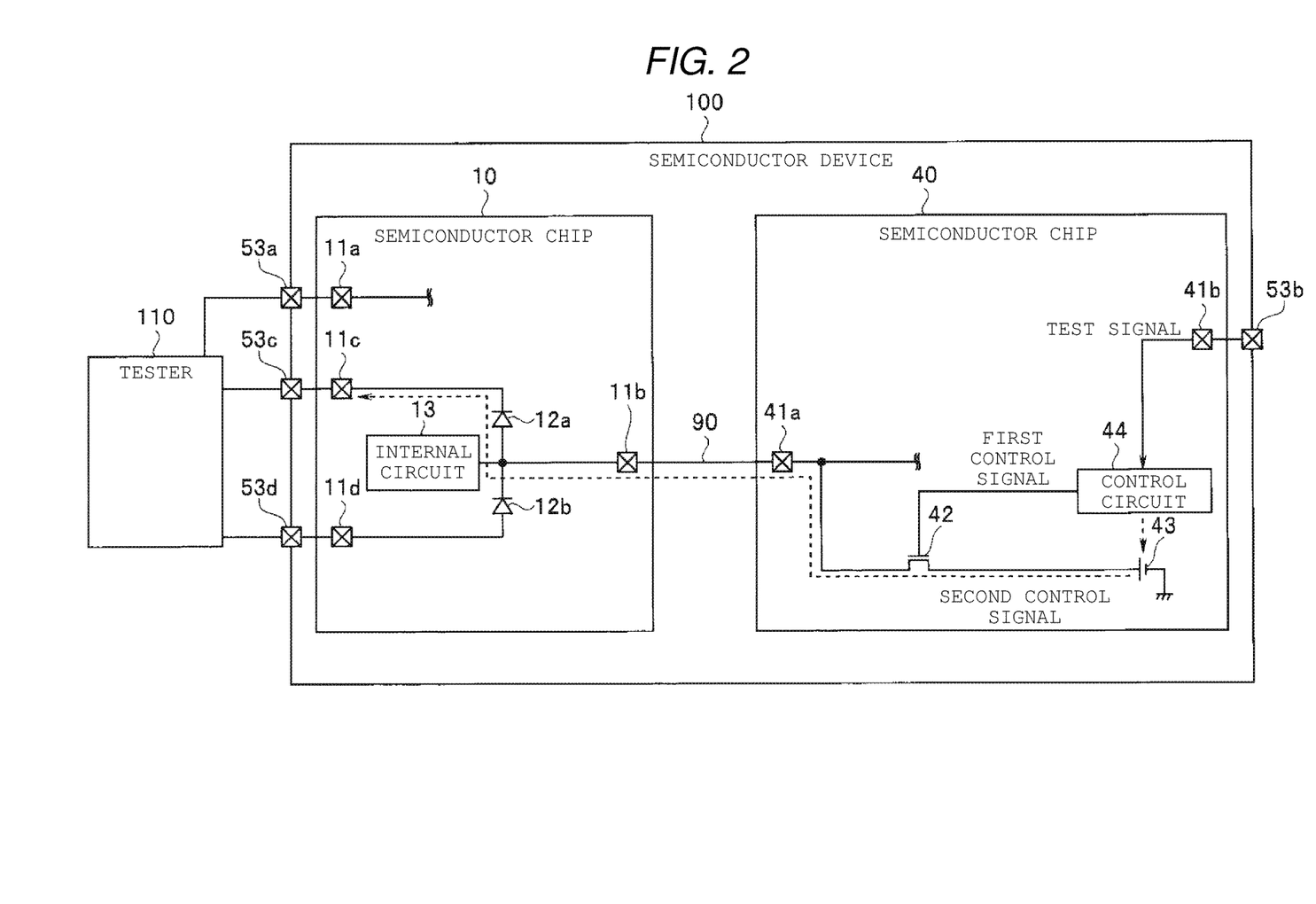
FIG. 2 is a block diagram of a semiconductor device according to a first embodiment.

FIG. 2 is a block diagram illustrating a configuration of the semiconductor device according to the first embodiment. In FIG. 2, the same components as those of FIG. 1 are represented by the same reference numerals.

In addition to the pads 11a and 11b, the semiconductor chip 10 includes a power supply pad 11c, a ground pad 11d, protective diodes 12a and 12b, and an internal circuit 13. The power supply pad 11c and the ground pad 11d are connected to the external terminal 53c (power supply terminal) and the external terminal 53d (ground terminal) through the wiring layer 51 of the wiring substrate 50.

The protective diodes 12a and 12b are protective diodes for protection against electrostatic breakdown and are provided between the power supply pad 11c and the ground pad 11d. In the protective diode 12b, an anode is connected to the ground pad 11d, and a cathode is connected to an anode of the protective diode 12a. A cathode of the protective diode 12a is connected to the power supply pad 11c.

The pad 11b is connected to a node between the protective diodes 12a and 12b and is connected to the internal circuit 13. In addition, the pad 11b is connected to the pad 41a of the semiconductor chip 40 through the internal wiring 90 in the semiconductor package.

In addition to the pads 41a and 41b, the semiconductor chip 40 includes a switch 42, a power supply circuit 43, and a control circuit 44.

The pad 41a is connected to the pad 11b of the semiconductor chip 10 through the internal wiring 90. The pad 41b is connected to the external terminal 53b through the bonding wire 70f, the bonding pad 52d, and the wiring layer 51b.

In addition, the pad 41b is connected to the control circuit 44, and a test signal is input from the external terminal 53b to the pad 41b, for example, using a tester 110. This test signal is input to the control circuit 44 through the pad 41b.

The switch 42 is provided between the pad 41a and the power supply circuit 43. The switch 42 is configured as a MOS transistor, and ON and OFF of the switch 42 is controlled by a first control signal (ON and OFF control signal) from the control circuit 44.

The power supply circuit 43 is provided between the switch 42 and the ground and is controlled by a second control signal from the control circuit 44. When the second control signal is input from the control circuit 44, the power supply circuit 43 outputs a current (constant current). Specifically, when the second control signal is input, the power supply circuit 43 continuously outputs a current of, for example, several ten μA to about 100 μA.

When the test signal is supplied from the pad 41b, the control circuit 44 outputs the first control signal (for turning on the switch 42) to the switch 42. In addition, when the test signal is supplied from the pad 41b, the control circuit 44 outputs the second control signal (for continuously outputting a current) to the power supply circuit 43.

When the current is output from the power supply circuit 43 such that the switch 42 is turned on, the current flows to the power supply pad 11c through the pad 41a, the internal wiring 90, the pad 11b, and the protective diode 12a. This way, when the current is being continuously output to the specific pad 41a connected to the internal wiring 90, a voltage between the power supply pad 11c and the ground pad 11d of the semiconductor chip 10 can be measured using a tester 110 to determine the connection state of the internal wiring 90.

Although the numerical value measured may vary depending on the ON characteristics of the protective diode 12a, for example, when the measured voltage between the power supply pad 11c and the ground pad 11d is 0.3 V or lower, the tester 110 determines that the internal wiring 90 is short-circuited (short-circuit defect), when the measured voltage is 0.9 V or higher, the tester 110 determines that the internal wiring 90 is open (open defect), and when the measured voltage is between 0.3 V and 0.9 V, the tester 110 determines that the internal wiring 90 is normally connected (test PASS).

In the example of FIG. 2, the connection detection test is executed only for that portion of the internal wiring 90 through which the pad 11b of the semiconductor chip 10 and the pad 41a of the semiconductor chip 40 are connected. However, the semiconductor device 100 includes a plurality of internal wirings 90. For example, the semiconductor device 100 includes separate internal wirings 90 for transmitting and receiving input and output signals, a timing signal, a clock signal, an enable signal, a ready/busy signal, and the like between the semiconductor chip 10 and the semiconductor chip 40. Therefore, the semiconductor device 100 has a configuration in which the connection detection test can also be executed for the internal wirings 90 other than the wirings of the power supply and the ground. The configuration in which the connection detection test can be executed for the internal wirings 90 will be described using FIG. 3.

Figure 3:
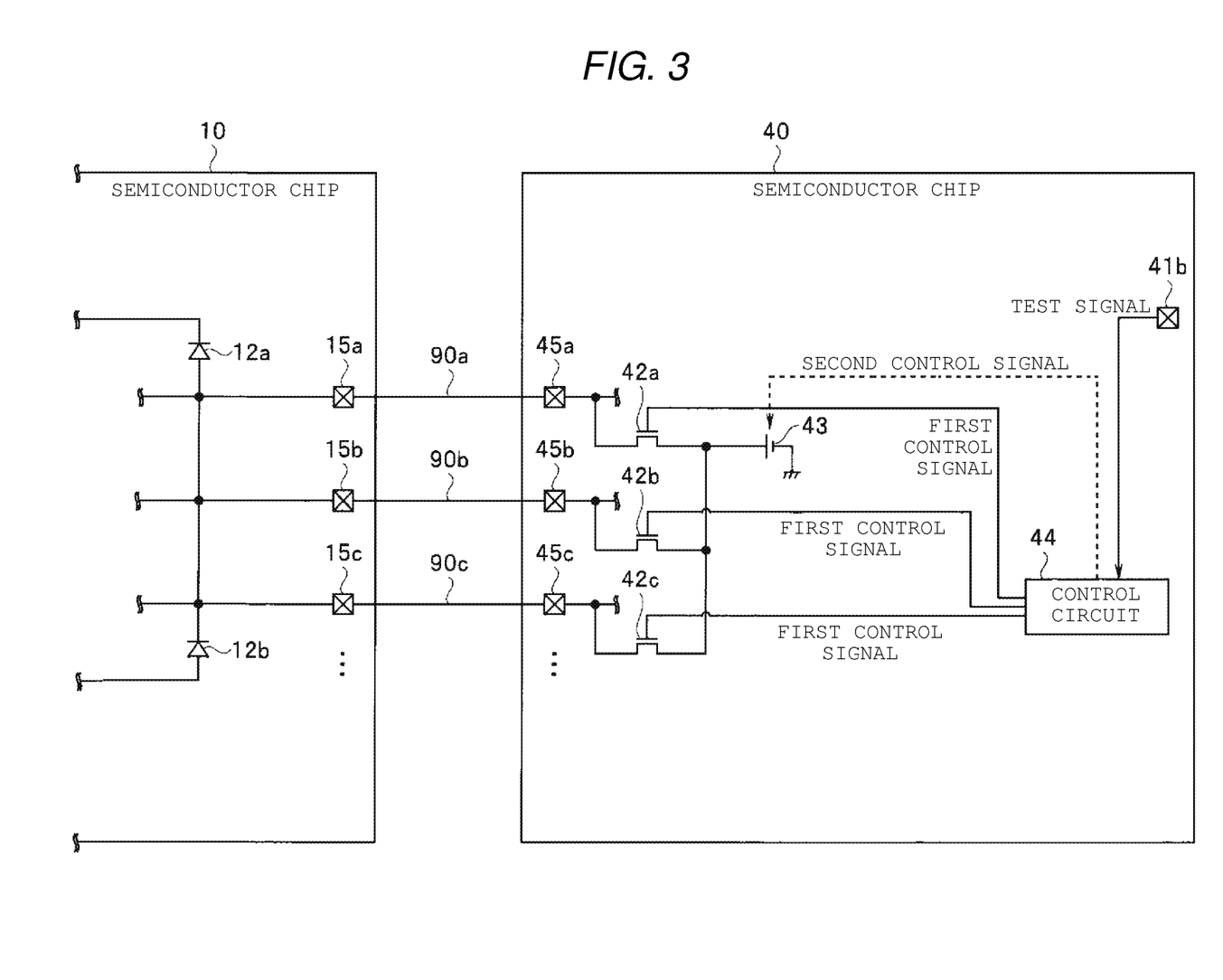
FIG. 3 is a block diagram a semiconductor device on which a connection detection test of a plurality of internal wirings is executed.

FIG. 3 is a block diagram illustrating a configuration of a semiconductor device for which the connection detection test of a plurality of internal wirings 90 is executed.

The semiconductor chip 10 includes a plurality of pads (15a, 15b, and 15c) for input and output. The pads 15a, 15b, and 15c can each be referred to as a "pad 15" or collectively as "pads 15".

The semiconductor chip 40 includes a plurality of pads (45a, 45b, and 45c) for input and output corresponding to the pads 15a, 15b, and 15c, respectively. The pads 45a, 45b, and 45c can each referred to as a "pad 45" or collectively as "pads 45".

The pads 15a, 15b, and 15c and the pads 45a, 45b, and 45c are respectively connected to each other through internal wirings 90a, 90b, and 90c. The internal wirings 90a, 90b, and 90c can each be referred to as an "internal wiring 90" or collectively as "internal wirings 90".

Each of the pads 15a, 15b, and 15c is connected to the node between the protective diodes 12a and 12b. In addition, switches 42a, 42b, and 42c are respectively provided between the pads 45a, 45b, and 45c and the power supply circuit 43. That is, the current output from the power supply circuit 43 can be supplied to the switches 42a, 42b, and 42c.

In addition, ON/OFF of each of the switches 42a, 42b, and 42c can be individually controlled by the first control signal from the control circuit 44. The switches 42a, 42b, and 42c each be referred to as a "switch 42" or collectively as "switches 42".

When the test signal is input, the control circuit 44 executes control such that the second control signal is output to the power supply circuit 43 and the current is output from the power supply circuit 43. The control circuit 44 outputs the first control signal to each of the switches 42a, 42b, and 42c to sequentially control ON and OFF of the switches 42a, 42b, and 42c and execute the connection detection test for the internal wirings 90a, 90b, and 90c.

Specifically, the control circuit 44 outputs a first control signal for turning on the switch 42a and turning off the switches 42b and 42c. As a result, the connection detection test can be executed for the internal wiring 90a connected to the pad 45a.

Next, the control circuit 44 outputs a first control signal for turning on the switch 42b and turning off the switches 42a and 42c. As a result, the connection detection test can be executed for the internal wiring 90b connected to the pad 45b.

Next, the control circuit 44 outputs a first control signal for turning on the switch 42c and turning off the switches 42a and 42b. As a result, the connection detection test can be executed for the internal wiring 90c connected to the pad 45c.

This way, with the current being continuously output from the power supply circuit 43, the control circuit 44 turns on the switches 42a, 42b, and 42c in turn. As a result, current can be caused to flow through only the internal wiring 90 connected to a specific pad 45 among the pads 45a, 45b, and 45c. As a result, the semiconductor device 100 can sequentially execute the connection detection tests of the internal wirings 90a, 90b, and 90c connected to the pads 45a, 45b, and 45c.

Figure 4:
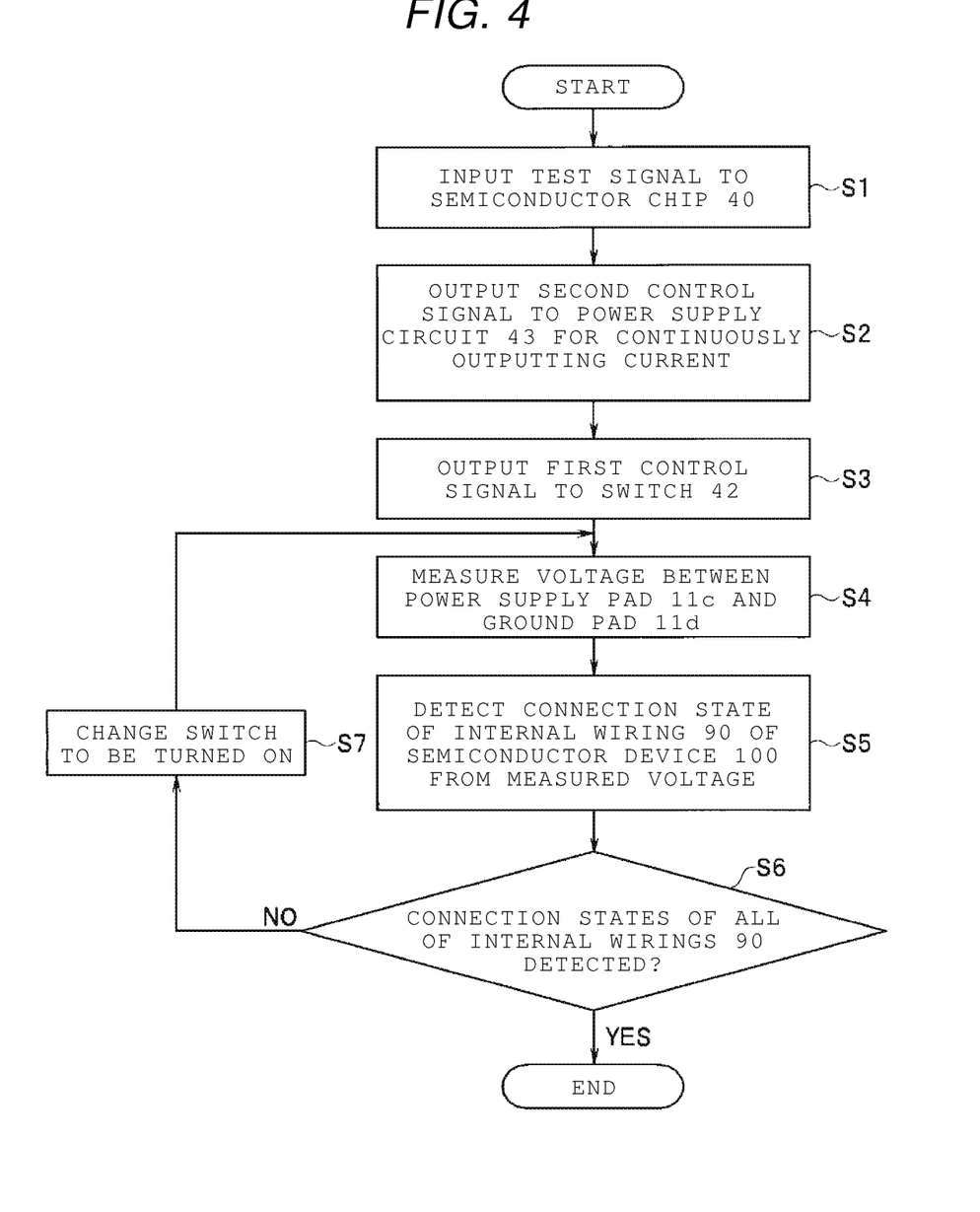
FIG. 4 is a flowchart of a connection detection test of a semiconductor device according to a first embodiment.

FIG. 4 is a flowchart illustrating an example of the connection detection test of the semiconductor device according to the first embodiment.

First, the test signal is input to the semiconductor chip 40 (Step S1). This test signal is input from the tester 110 to the control circuit 44 through the pad 41b.

When the test signal is input, the control circuit 44 outputs the first control signal to the switch 42 (Step S2). At this time, the control circuit 44 outputs the first control signal for turning on the switch 42 provided between the power supply circuit 43 and the pad 45 connected to the internal wiring 90 on which the connection detection test is to be executed.

Next, the control circuit 44 outputs the second control signal for causing a current to be continuously output from the power supply circuit 43 (Step S3). As a result, a current of about 100 μA, for example, is continuously output from the power supply circuit 43, and the current flows to the power supply pad 11c through the pad 45, the internal wiring 90, the pad 15, and the protective diode 12a.

Next, the tester 110 measures a voltage between the power supply pad 11c and the ground pad 11d (Step S4). The tester 110 detects the connection state of the internal wiring 90 of the semiconductor device 100 based on the measured voltage (Step S5). As described above, when the measured voltage is 0.3 V or lower, the tester 110 determines that a short-circuit defect occurs, when the measured voltage is 0.9 V or higher, the tester 110 determines that an open defect occurs, and when the measured voltage is higher than 0.3 V but lower than 0.9 V, the tester 110 determines that the test is PASS.

Next, the control circuit 44 determines whether the connection states of all of the internal wirings 90 have been detected (tested) (Step S6). When the control circuit 44 determines that the connection states of all of the internal wirings 90 are not yet detected, the control circuit 44 changes the switch 42 (e.g., moves on to the next switch 42 in the test sequence) that is to be turned on (Step S7), and returns to the process of Step S4. However, when the control circuit 44 determines that the connection states of all of the internal wirings 90 have been detected, the control circuit 44 ends the process.

As described above, in the semiconductor device 100, the test signal is input to the control circuit 44, and a connection detection test of internal wiring 90 is executed by controlling ON and OFF states of the switch(es) 42 as well as the power supply circuit 43. The semiconductor chip 40 is, for example, a NAND flash memory and includes the power supply circuit 43 and the control circuit 44 for writing and reading data.

That is, in the semiconductor device 100, the connection detection test of the internal wiring 90 can be executed simply by providing the switch 42 between the power supply circuit 43 and the pad 45 in an otherwise existing circuit configuration. Therefore, in the semiconductor device 100, a circuit for connection detection that is configured with, for example, a comparator or a boundary scan cell does not need to be provided, but the connection detection test of the internal wiring 90 can still be executed.

Accordingly, in the semiconductor device 100, the connection detection test of the internal wiring 90 that is connected inside the semiconductor package can be executed without substantially increasing the circuit area.

Second Embodiment

Figure 5:
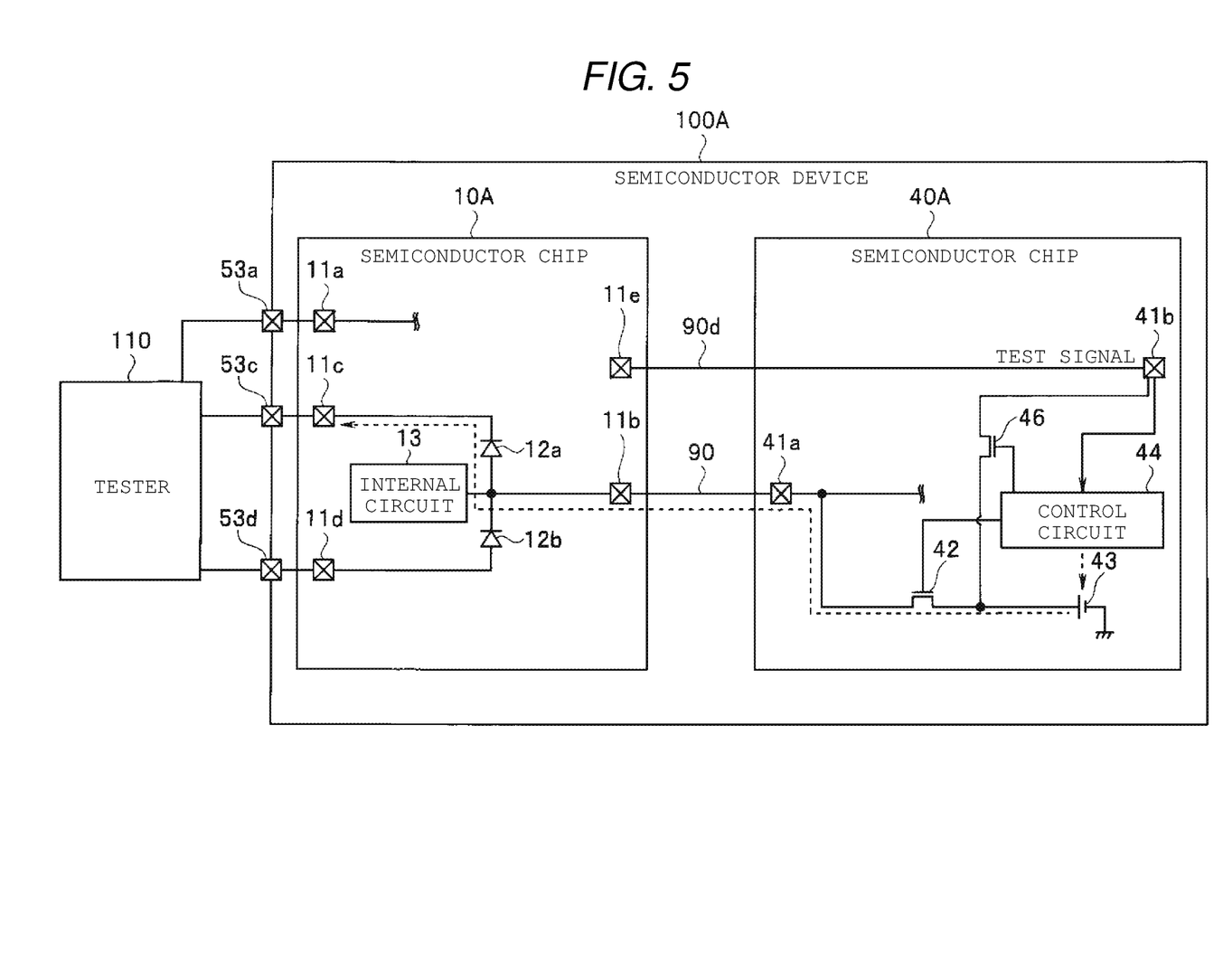
FIG. 5 is a block diagram of a semiconductor device according to a second embodiment.

FIG. 5 is a block diagram illustrating a configuration of a semiconductor device according to the second embodiment.

As illustrated in FIG. 5, a semiconductor device 100A is configured with semiconductor chips 10A and 40A instead of the semiconductor chips 10 and 40. In the semiconductor chip 10A, a pad 11e is also added to the semiconductor chip 10 of FIG. 2. In the semiconductor chip 40A, a switch 46 is added to the semiconductor chip 40 of FIG. 2.

The pad 41b of the semiconductor chip 40A is not connected to an external terminal 53 but is connected to the pad 11e in the semiconductor device 100A. The pad 11e is connected to the pad 41b of the semiconductor chip 40A through an internal wiring 90d inside the semiconductor package. The switch 46 is provided between the pad 41b and the power supply circuit 43. When the internal wiring 90d does not need to be distinguished from the other internal wirings, the internal wiring 90d can be referred to as an "internal wiring 90".

When the test signal is input from the tester 110, the semiconductor chip 10A outputs the test signal to the semiconductor chip 40A through the pad 11e and the internal wiring 90d. In some examples, when a signal for starting the connection detection test is input from the tester 110, the semiconductor chip 10A may itself generate a test signal for a connection detection test in the internal circuit and may output the test signal to the semiconductor chip 40A through the pad 11e and the internal wiring 90d. After the test signal is output to the semiconductor chip 40A, the semiconductor chip 10A stops the supply of power from the tester 110.

The test signal input to the semiconductor chip 40A is input to the control circuit 44 through the pad 41b. When the test signal is received, the control circuit 44 executes a connection detection test of the internal wiring 90 as in the first embodiment.

In addition, after the test signal is received, the control circuit 44 outputs the first control signal for turning on the switch 46. As a result, the current from the power supply circuit 43 flows to the pad 11e of the semiconductor chip 10A through the pad 41b and the internal wiring 90d. Therefore, the connection detection test of the internal wiring 90d can be executed.

In the example of FIG. 5, the test signal is transmitted between the semiconductor chips 10A and 40A through a single internal wiring 90d. However, the embodiment is not limited to this configuration. For example, a signal line group (internal wirings 90d) for transmitting and receiving a signal DQ <7:0> such as for data input/output can be provided between the semiconductor chips 10A and 40A. Therefore, the semiconductor chip 10A may transmit the test signal to the control circuit 44 of the semiconductor chip 40A through eight internal wirings 90d.

Figure 6:
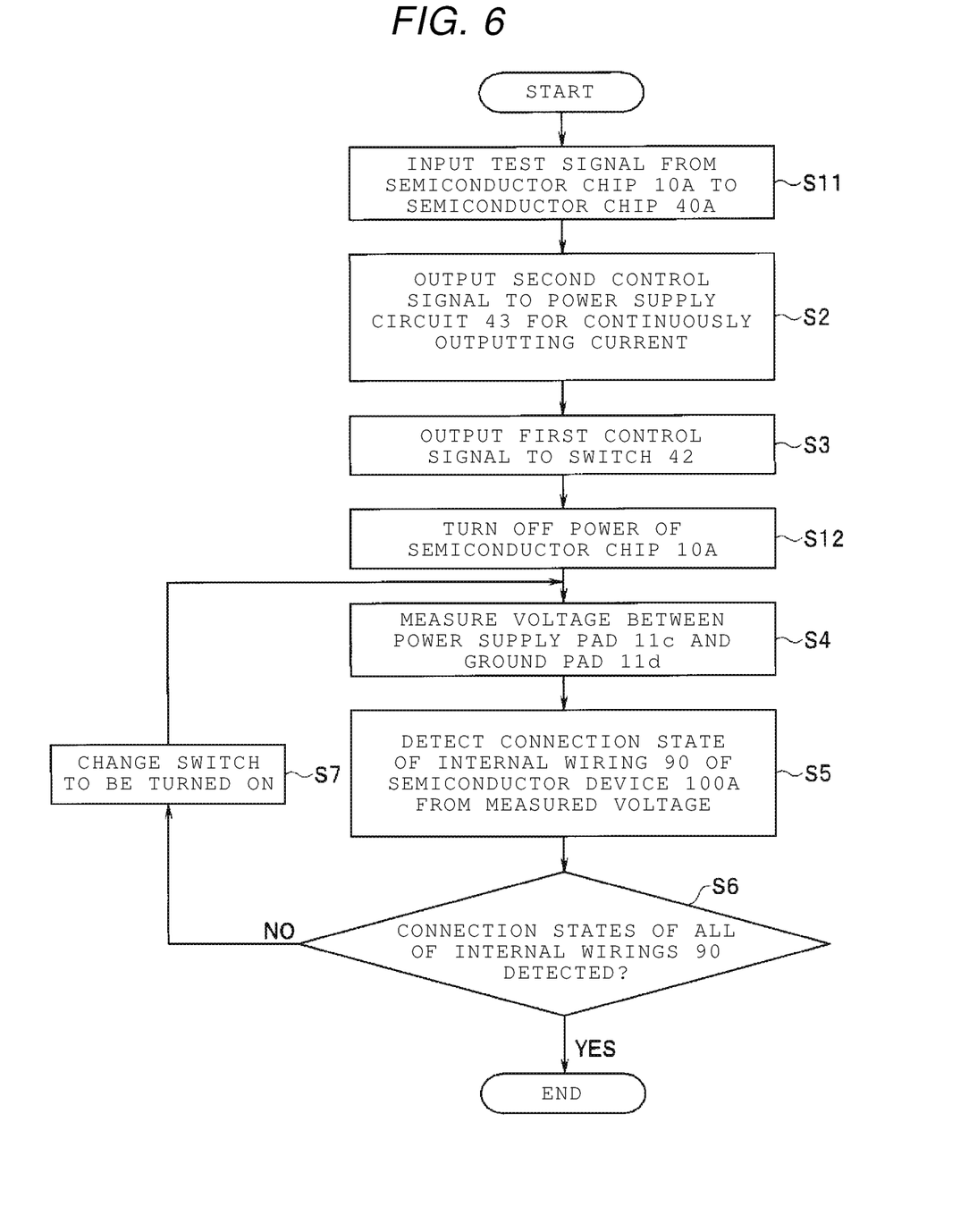
FIG. 6 is a flowchart of a connection detection test of a semiconductor device according to a second embodiment.

FIG. 6 is a flowchart illustrating an example of the connection detection test of the semiconductor device according to the second embodiment. In FIG. 6, the same processes as those of FIG. 4 are represented by the same reference numerals, and the description thereof will not be repeated.

First, the test signal is sent from the semiconductor chip 10A to the semiconductor chip 40A (Step S11). The test signal is input to the control circuit 44 through the pad 11e of the semiconductor chip 10A, the internal wiring 90d, and the pad 41b of the semiconductor chip 40A. When the test signal is input, the control circuit 44 outputs the first control signal to the switch 42 in the process of Step S2 and outputs the second control signal to the power supply circuit 43 in the process of Step S3.

Next, the power of the semiconductor chip 10A is turned off (Step S12). That is, the supply of power from the tester 110 to the semiconductor chip 10A is stopped. As a result, the power is not applied to the power supply pad 11c of the semiconductor chip 10A. Therefore, a test voltage between the power supply pad 11c and the ground pad 11d can be measured.

When the power of the semiconductor chip 10A is turned off, the tester 110 measures a voltage between the power supply pad 11c and the ground pad 11d in the process of Step S4 and detects the connection state of the internal wiring 90 of the semiconductor device 100A based on the measured voltage in the process of Step S5.

Next, in the process of Step S6, the control circuit 44 determines whether the connection states of all of the internal wirings 90 have been detected. When the control circuit 44 determines that the connection states of all of the internal wirings 90 are not yet detected, the control circuit 44 changes the switch 42 to be turned on in the process of Step S7, and returns to the process of Step S4. However, when the control circuit 44 determines that the connection states of all of the internal wirings 90 have been detected, the control circuit 44 ends the process.

As described above, even in a configuration where the test signal cannot be directly input from the tester 110 to the semiconductor chip 40A, the semiconductor device 100A transmits the test signal to the semiconductor chip 40A through the semiconductor chip 10A. As a result, in the semiconductor chip 40A that receives the test signal, the connection detection test of the internal wiring 90 can be executed as in the first embodiment.

Accordingly, in the semiconductor device 100A, the connection detection test of the internal wiring 90 that is connected inside the semiconductor package can be executed as in the first embodiment without substantially increasing the circuit area.

Regarding the steps in the flowchart of the present specification, in a range not departing from the scope, the execution order may be changed, a plurality of steps may be executed at the same time, or the steps may be executed in different orders for each execution.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first semiconductor chip in a package;
a second semiconductor chip in the package;
a first pad on the first semiconductor chip and electrically connected to a node between a power supply pad and a ground pad on the first semiconductor chip;
a second pad on the second semiconductor chip;
a third pad on the second semiconductor chip;
an internal wiring connecting the first pad to the second pad within the package;
a power supply circuit on the second semiconductor chip configured to supply a current to the second pad;
a switch on the second semiconductor chip between the second pad and the power supply circuit to connect or disconnect the second pad from the power supply circuit; and
a control circuit on the second semiconductor chip configured to output:
a first control signal for controlling ON and OFF states of the switch in response to a test signal supplied to the third pad, and
a second control signal to the power supply circuit to cause the power supply circuit to output current.

2. The semiconductor device according to claim 1, further comprising:
a first external terminal on an outside of the package, the first external terminal being electrically connected to the third pad.

3. The semiconductor device according to claim 2, wherein the first external terminal is electrically connected to the third pad via another internal wiring connected to a pad on the first semiconductor chip.

4. The semiconductor device according to claim 2, further comprising:
a wiring substrate on which the first and second semiconductor chips are mounted, wherein
the first external terminal is electrically connected to the third pad via an interconnection in the wiring substrate.

5. The semiconductor device according to claim 4, wherein third pad is connected to the interconnection by a bonding wire extending from the third pad to a pad on the wiring substrate electrically connected to the interconnection.

6. The semiconductor device according to claim 4, wherein the internal wiring is another interconnection in the wiring substrate.

7. The semiconductor device according to claim 1, wherein the test signal is generated and supplied by an external tester connected to an external terminal of the package.

8. The semiconductor device according to claim 1, wherein the first semiconductor chip includes an internal circuit configured to generate and supply the test signal in response to an external signal supplied to an external terminal of the package.

9. The semiconductor device according to claim 1, wherein
the first semiconductor chip is a controller chip, and
the second semiconductor chip is a memory chip.

10. The semiconductor device according to claim 1, wherein
the first semiconductor chip includes a plurality of the first pads,
the second semiconductor chip includes a plurality of the second pads corresponding to the first pads, respectively,
a plurality of internal wirings respectively connecting the first pads and the second pads, and a plurality of the switches respectively between the second pads and the power supply circuit, and
the control circuit is further configured to output first control signals for controlling ON and OFF states of each of the switches in sequence.

11. The semiconductor device according to claim 1, wherein the first semiconductor chip and the second semiconductor chip are connected to the internal wiring at internal wiring ends most distant from each other.

12. The semiconductor device according to claim 1, wherein the internal wiring is a bonding wire connecting the first pad and the second pad.

13. The semiconductor device according to claim 1, wherein
the first pad and the second pad are directly connected to a wiring substrate, and
the internal wiring is in the wiring substrate.

14. The semiconductor device according to claim 1, further comprising:
a first protective diode between the node and the power supply pad; and
a second protective diode between the node and ground pad.

15. The semiconductor device according to claim 1, wherein the second pad is electrically connected to an internal circuit of the second semiconductor chip along a path not passing through the switch.

16. A packaged semiconductor device, comprising:
   a wiring substrate;
   a first semiconductor chip on the wiring substrate;
   a second semiconductor chip on the wiring substrate;
   a first pad on the first semiconductor chip and electrically connected to a node between a power supply pad and a ground pad on the first semiconductor chip;
   a second pad on the second semiconductor chip;
   a third pad on the second semiconductor chip;
   an internal wiring connecting the first pad to the second pad;
   a power supply circuit on the second semiconductor chip configured to supply a current to the second pad;
   a switch on the second semiconductor chip between the second pad and the power supply circuit to connect or disconnect the second pad from the power supply circuit;
   a control circuit on the second semiconductor chip configured to output:
      a first control signal for controlling ON and OFF states of the switch in response to a test signal supplied to the third pad, and
      a second control signal to the power supply circuit to cause the power supply circuit to output current; and
   a sealing resin covering the first and second semiconductor chips, the internal wiring, and a first surface of the wiring substrate.

17. The packaged semiconductor device according to claim 16, wherein the internal wiring comprises a bonding wire.

18. The packaged semiconductor device according to claim 16, wherein the third pad is electrically connected to an external terminal on a second surface of the wiring substrate on an opposite side of the wiring substrate from the first surface via a bonding wire connecting to the third pad to a pad terminal on the first surface of the wiring substrate.

19. A test method for a packaged semiconductor device including an internal wiring connecting a first pad on a first semiconductor chip to a second pad on a second semiconductor chip, the test method comprising:
   receiving a test signal at a third pad on the second semiconductor chip, the third pad being electrically connected to a control circuit on the second semiconductor chip;
   outputting a first control signal from the control circuit to a power supply circuit on the second semiconductor chip in response to the receiving of the test signal at the third pad, the first control signal causing the power supply circuit to output a current to a wiring connected to the second pad;
   outputting a second control signal from the control circuit to a switch in response to the receiving of the test signal at the third pad, the switch being on the wiring connecting the second pad and the power supply circuit and controlling whether current from the power supply circuit reaches the internal wiring via the second pad;
   measuring a voltage between a power supply pad and a ground pad, the first pad being electrically connected to a node between the power supply pad and the ground pad; and
   detecting a connection state of the internal wiring based on the measuring of the voltage.

20. The test method according to claim 19, wherein the packaged semiconductor device is a multi-chip memory device.

* * * * *

UNITED STATES PATENT AND TRADEMARK OFFICE
CERTIFICATE OF CORRECTION

| | |
|---|---|
| PATENT NO. | : 11,892,503 B2 |
| APPLICATION NO. | : 17/898102 |
| DATED | : February 6, 2024 |
| INVENTOR(S) | : Takuya Kusaka |

Page 1 of 1

It is certified that error appears in the above-identified patent and that said Letters Patent is hereby corrected as shown below:

On the Title Page

Item (73) Assignee, Please change "Toshiba Tec Kabushiki Kaisha" to --Kioxia Corporation--.

Signed and Sealed this
Twenty-second Day of April, 2025

Coke Morgan Stewart
*Acting Director of the United States Patent and Trademark Office*